US005304734A

United States Patent [19]

Kunimoto

[11] Patent Number: 5,304,734

[45] Date of Patent: Apr. 19, 1994

[54] MUSICAL SYNTHESIZING APPARATUS FOR PROVIDING SIMULATION OF CONTROLLED DAMPING

[75] Inventor: Toshifumi Kunimoto, Hamamatsu, Japan

[73] Assignee: Yamaha Corporation, Hamamatsu, Japan

[21] Appl. No.: 717,380

[22] Filed: Jun. 19, 1991

[30] Foreign Application Priority Data

Jun. 20, 1990 [JP] Japan .................................. 2-161864

[51] Int. Cl.[5] ........................ G10H 5/00; G10H 1/12; H03H 7/01

[52] U.S. Cl. ........................................ 84/661; 84/622; 84/626

[58] Field of Search .................................. 84/600-603, 84/607, 608, 622, 623, 626, 630, 647, 661, 662, DIG. 9, DIG. 10

[56] References Cited

U.S. PATENT DOCUMENTS

| | | | |
|---|---|---|---|
| 4,736,663 | 4/1988 | Wawrzynek et al. | 84/DIG. 9 X |
| 4,815,354 | 3/1989 | Kunimoto | 84/DIG. 9 X |
| 4,868,869 | 9/1989 | Kramer | 84/622 |
| 4,909,119 | 3/1990 | Morokuma | 84/DIG. 26 X |
| 4,909,121 | 3/1990 | Usa et al. | 84/606 |
| 5,113,743 | 5/1992 | Higashi | 84/622 |
| 5,117,729 | 6/1992 | Kunimoto | 84/660 |
| 5,117,730 | 6/1992 | Yamauchi | 84/723 |
| 5,157,214 | 10/1992 | Nakanishi et al. | 84/622 |
| 5,157,218 | 10/1992 | Kunimoto et al. | 84/659 |
| 5,166,464 | 11/1992 | Sakata et al. | 84/662 |
| 5,241,127 | 8/1993 | Kobayashi | 84/606 |

FOREIGN PATENT DOCUMENTS 0248527 4/1987 European Pat. Off. .

*Primary Examiner*—William M. Shoop, Jr.
*Assistant Examiner*—Jeffrey W. Donels
*Attorney, Agent, or Firm*—Graham & James

[57] ABSTRACT

A musical tone synthesizing apparatus for synthesizing musical tones generated by acoustic instruments. In the musical tone synthesizing apparatus, a closed loop circuit is provided to simulate the vibration of a vibrating element, for example, a string of piano. Additionally provided is a excitation and damping control unit for generating signals to be introduced to the closed loop circuit. When generating musical tones, the excitation and damping control unit generates an excitation signal corresponding to the excitation operation applied to the vibrating element from a excitation element, for example, a hamper of piano. When damping the musical tones, the excitation and damping control unit generates a signal corresponding to the excitation operation applied to the vibrating element from a damping element, for example, a damper of piano.

8 Claims, 4 Drawing Sheets

MUSICAL SYNTHESIZING APPARATUS FOR PROVIDING SIMULATION OF CONTROLLED DAMPING

BACKGROUND OF THE INVENTION

1. Field of the Invention

The present invention relates to musical tone synthesizing apparatuses, and more particularly, to musical tone synthesizing apparatuses applicable to synthesis of the sound of stringed instruments, especially plucked or percussive stringed instruments.

2. Prior Art

Various musical tone generating apparatuses are conventionally known, wherein the sound of one or more conventional, non-electronic musical instruments is synthesized through simulation of the mechanism of sound generation for each target instrument.

Examples of this type of apparatus include that disclosed in Japanese Patent Application, First Publication No. Sho-63-40199 and that disclosed in Japanese Patent Application, Second Publication No. Sho-58-58679, both of which are apparatuses which simulate the mechanism, and in this way synthesize the sound of plucked or percussive stringed instruments. Typically, these apparatuses include one or more closed loop circuits wherein the action of a vibrating string is simulated. Additionally, an excitation signal generating circuit is provided from which an excitation signal can be input into the closed loop circuit, and which acts to simulate the input of mechanical energy into a string of the conventional instrument, that is, the excitation signal generating circuit simulates the plucking or striking of a string in a plucked or percussive stringed instrument, respectively.

The above described closed loop circuit incorporates a low-pass filter and delay circuit in serial. The low-pass filter simulates acoustical losses which occur in a vibrating string following plucking or striking thereof, in other words, the time decay in amplitude of vibration, and hence of mechanical energy, in the vibrating string. The delay circuit acts to simulate the propagation delay imparted to waves traveling back and forth along the length of the string.

As mentioned above, the excitation signal generating circuit simulates the input of mechanical energy into a string of a stringed instrument. To do so, the excitation signal generating circuit injects an excitation signal, for example, an impulse signal into the closed loop circuit which then proceeds to circulate repeatedly therearound, the rate of circulation dependent on the characteristics of the above mentioned delay circuit, the energy of the circulating signal decaying with time at a rate dependent on the characteristics of the above mentioned low-pass filter. After the excitation signal has been input into the closed loop circuit, the circulating signal is sampled, thereby obtaining an output signal which represents the simulated sound of the target instrument.

With conventional stringed instruments, a damping operation is often applied to one or more of the vibrating strings during a performance. Depending on the technique employed by the performer as expressed by rate and intensity of damping, the vibration of a string and hence the sound produced thereby can be caused to gradually fade away or to suddenly stop. In the case of a conventional piano, each key is provided with a dedicated damping mechanism which includes a felt covered damping block which is brought into contact with the corresponding string or strings when the key is released, assuming that the sustain pedal is not depressed.

Aside from the piano or harpsichord, most other stringed instruments do not included a dedicated damping mechanism, for which reason musicians generally apply one of various manual damping techniques when it is desired to terminate the sound generation of one or more strings, or when a decrescendo effect is desired. Most often, these techniques involve pressing a finger or hand against the corresponding strings with a variable degree of pressure.

In the case of a guitar, when it is desired to damp all of the strings, a right handed player will most often press the ulnar aspect of his/her right hand against the strings in proximity to the bridge of the guitar, or alternately, the shaft of his/her left thumb at a position over the fretboard. When it is desired to selectively damp one or more strings, for open strings, the right handed player will generally apply the tip of one of the left fingers or thumb to each string to be damped. Additionally, for strings not open, damping can be effected by partially or completely releasing the finger which is holding a string against the fretboard.

In the case of electronic apparatuses which simulate the sound of conventional stringed instruments, none of the conventionally known apparatuses incorporate a means for simulation of controlled damping as described above. Ordinarily, in order to attenuate or stop the simulated tone corresponding to a vibrating string, these apparatuses incorporate a variable gain amplifier/attenuator circuit within the closed loop circuit. By this means, the amplitude of the generated signal can be caused to diminish gradually, or to terminate suddenly. Finely controlled damping as employed by musicians playing conventional stringed instruments, however, is generally not possible with these conventional apparatuses. Consequently, the ability to synthesize fully natural sounding musical tones is compromised with the result that music produced by such apparatuses tends to sound unrealistic.

SUMMARY OF THE INVENTION

In consideration of the above described shortcoming characteristic of conventional apparatuses for synthesizing the sound of conventional non-electronic instruments, it is an object of the present invention to provide a musical tone synthesizing apparatus which is applicable to synthesis of the sound of a target conventional musical instrument having a vibrating element to which mechanical energy and thereby vibration is imparted through the action of an excitation operator, the musical tone synthesizing apparatus capable of synthesizing the sound of the target musical instrument with high fidelity, including the sound achieved when a damping operation is applied thereto, whereby an exceedingly natural sound can be produced which is fully characteristic of the target instrument.

So as to achieve the above described object, the present invention provides a musical tone synthesizing apparatus which synthesizes musical tones of an acoustic instrument containing a vibrating element having its specific resonance characteristic and an excitation operator for imparting an excitation vibration to said vibrating element, said musical tone synthesizing apparatus comprising:

a) a closed loop circuit containing at least a delay element, said closed loop circuit corresponding to said vibrating element;
b) excitation signal generating means for generating an excitation signal which is input into said closed loop circuit, the excitation signal corresponding to the action of said excitation operator; and
c) damping means wherein an output signal from said closed loop circuit is subjected to predetermined processing, the signal resulting therefrom then supplied to said closed loop circuit as a feedback signal, the input of said feedback signal into said closed loop circuit corresponding to the application of a damping operation to said vibrating element of the acoustic instrument.

The other objects and features of this invention will be understood from the following description with reference to the accompanying drawings.

DETAILED DESCRIPTION OF THE PREFERRED EMBODIMENTS

In the following, the preferred embodiments of the present invention will be described in detail with reference to the appended drawings.

Figure 1:
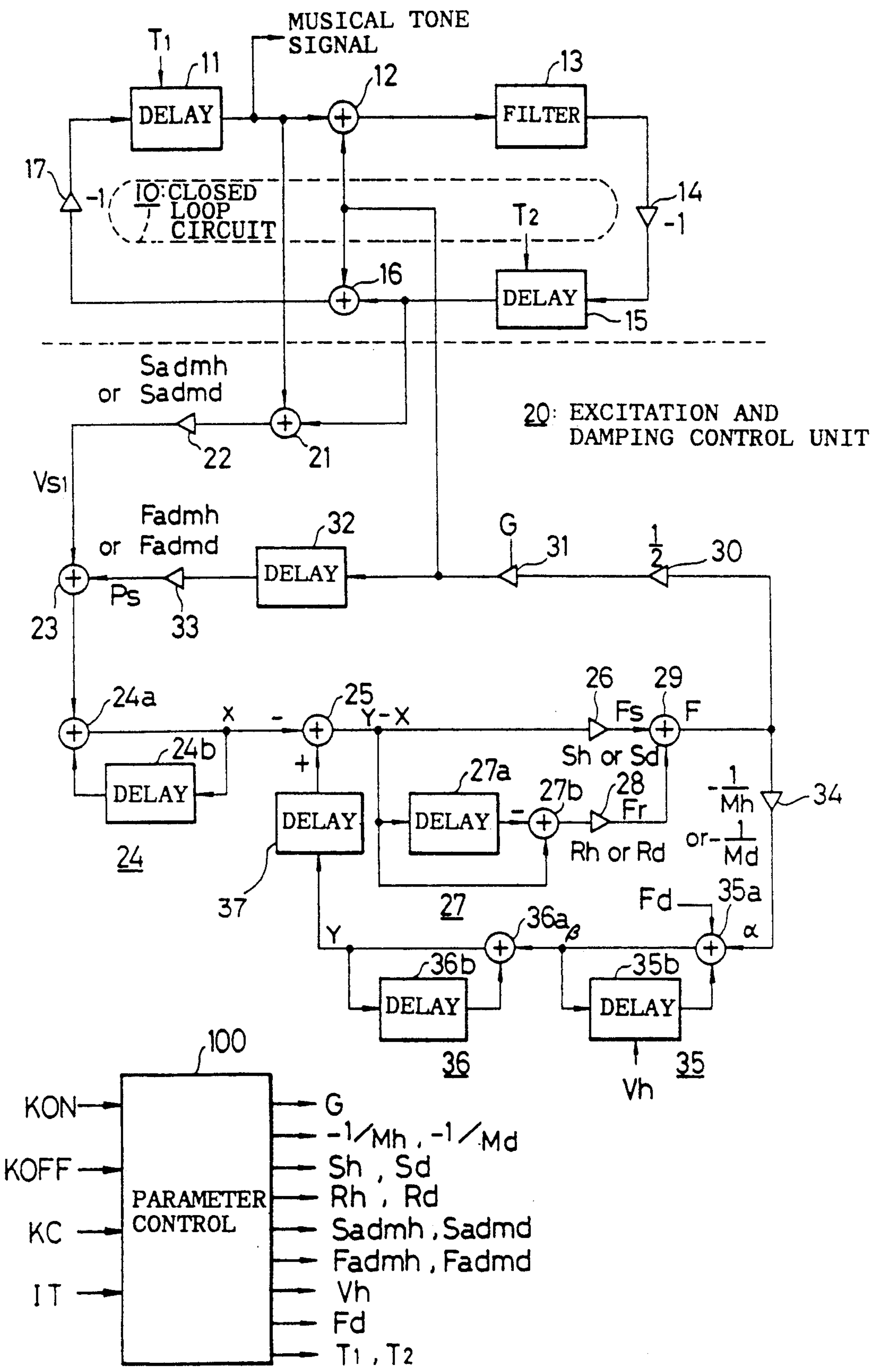
FIG. 1 is a block diagram showing the overall layout of a musical tone synthesizing apparatus in accordance with a first preferred embodiment of the present invention.

In FIG. 1, the general layout of a musical tone generating apparatus in accordance with a first preferred embodiment of the present invention can be seen. Although the apparatus shown in FIG. 1 is applicable to synthesis of the sound of a conventional piano, and much of the description of the operation and function thereof is presented through analogy to the mechanism of sound generation in a piano, it should be understood that the present embodiment is in no way so limited.

In the present embodiment, a keyboard (not shown in the drawings) is used as the input apparatus whereby the individual operating the apparatus inputs performance data. Operation of the keyboard is translated into a number of signals expressing different aspects of the operator's performance which are then supplied to a parameter control unit 100 which can be seen in FIG. 1.

For example, when the operator depresses one of the keys on the keyboard, a key-on signal KON indicating that a key-on event has taken place, key-code data KC indicating which key has been depressed and initial touch data IT expressing the force of the key depression are supplied to parameter control unit 100, whereupon parameters are generated expressing the operations whereby excitation of a string in the target instrument. Thus, when the target instrument is a piano, depression of a key on a keyboard employed as the input apparatus results in generation of parameters in parameter control unit 100, which when supplied to following circuits, effect control thereof whereby the events and operation associated with depression of a corresponding key on a conventional piano are simulated, namely, the excitation and resulting vibration induced in one or more corresponding strings of the target piano by means of a hammer striking the string or strings.

Upon release of the depressed key, key-off data KOFF indicating that a key-off event has taken place is supplied from the keyboard to parameter control unit 100, resulting in generation of parameters therein which effect control of following circuits whereby damping of vibration in the corresponding string or strings in the target instrument is simulated. For example, when the target instrument is a piano, the operation of bringing a damper block into contact with one or more vibrating strings which takes place following release of the corresponding key is simulated.

To describe in greater detail, the apparatus of the present embodiment includes a closed loop circuit 10 as shown in FIG. 1, wherein propagation of waves traveling back and forth along the length of a vibrating string is simulated. This closed loop circuit 10 consists in turn of a delay circuit 11, adder 12, filter 13, phase inverter 14, delay circuit 15, adder 16 and phase inverter 17 arranged sequentially in series so as to form a closed loop.

Programmable delay circuits are suitable for the above mentioned delay circuits 11 and 15, thereby making it possible to freely select different values for the propagation delay within a vibrating string of the target instrument under simulation, in this way making it possible to simulate strings having different physical characteristics, for example, differences in the length, tension, diameter, etc.

When parameter control unit 100 receives a key-on signal KON and key-code data KC, the parameters generated therein include delay designation data T1 and T2 which are generated based on the supplied key-code data KC which indicates what key is associated with the key-on event. Delay designation data T1 and T2 are then supplied to delay circuit 11 and delay circuit 15, respectively, whereby the delay intervals within closed loop circuit 10 are set so that a vibrating string having a fundamental frequency identical to that of the key with which the key-on event is associated can be simulated. For the each of the programmable delay circuits used as delay circuits 11 and 15, shift registers can be suitably applied therefor, the shift register having an output which can be delayed by a variable number of clock signals depending on a delay designation parameter supplied to a selector unit thereof.

As mentioned above, closed loop circuit 10 includes a filter 13 as a serial component thereof which is used to simulate acoustical losses of mechanical energy in the simulated vibrating string, and hence, to simulate the time decay of amplitude of the sound produced thereby. Because the amplitude of higher frequency harmonics tends to decay more rapidly than that of lower frequency harmonics in the strings of an actual stringed instrument, a low-pass filter is tyically used for filter 13.

In an actual stringed instrument, each string is fixed at a fixation point at either end thereof, thereby delineating a range over which the string is free to vibrate, and over which waves propagate back and forth therealong. When a propagating wave reaches one of the fixation points, the wave is reflected in the opposite direction, incurring a phase reversal with each such reflection. So as to simulate this phenomena, closed loop circuit 10 in the present embodiment includes two phase inverters as serial components therein, phase inverter 14 and phase inverter 17, each simulating a respective fixation point of a string in the target instrument.

External to closed loop circuit 10, the apparatus of the present embodiment includes an excitation and damping control unit 20, which as the name implies, simulates the operation of exciting a string, that is, the operation of injecting mechanical energy into a string of the target instrument, thereby inducing vibration therein. Furthermore, excitation and damping control unit 20 simulates the operation of damping a vibrating string which takes place, for example, when a depressed key of a piano corresponding to a vibrating string is released, thereby resulting in an accelerated decay, and finally cessation of vibration in that string, together with the sound produced thereby.

When the target instrument is a piano, after a key-on signal KON and key-code data KC have been detected, parameter control unit 100 generates a set of parameters appropriate for simulating an excitation of the piano string to which the supplied key-code data KC corresponds, as well as for simulating the vibrating string itself. Based on the supplied parameters, excitation and damping control unit 20 then generates an excitation signal suitable for simulating the striking of a piano string with a hammer, after which the signal thus generated is supplied to closed loop circuit 10 via adders 12, 16. In this way, the operation and effect which takes place when a key on a piano is depressed are effectively simulated, namely, the striking of the corresponding piano string with a hammer, and the vibration in the string caused thereby. Following the key-on event, after a key-off signal is subsequently detected for the corresponding key, parameter control unit 100 generates a set of parameters appropriate for simulating a damping operation applied to the vibrating string. Based on the supplied parameters, excitation and damping control unit 20 then generates a damping signal which when supplied to closed loop circuit 10, interacts with the signal circulating therein so as to effect a decay in the amplitude of the circulating signal, such that the decay in the amplitude achieved thereby simulates the decay in amplitude which occurs in an actual vibrating piano string when a damper block is brought into contact with the string following the release of the corresponding key.

Excitation and damping control unit 20 not only supplies signals to closed loop circuit 10, but also receives an output signal therefrom via an adder 21, wherein the two signals obtained by sampling closed loop circuit 10 immediately following the above mentioned delay circuit 11 and delay circuit 15 are summed. In addition to serving as the basis for an output signal of the tone generating apparatus of the present invention as a whole, this signal also acts as a feedback signal which effects the function of excitation and damping control unit 20.

The result of the addition in adder 21 is supplied to a multiplier 22, wherein the supplied signal is multiplied by a multiplication coefficient supplied from parameter control unit 100. For the interval starting with a key-on event and ending just prior to the corresponding key-off event, the signal supplied to multiplier 22 from adder 21 is multiplied by a multiplication coefficient Sadmh from parameter control unit 100. The multiplication coefficient Sadmh is adjusted to an appropriate value considering the efficiency of the mechanical energy flow between a hammer and a string. For the interval following a key-off event over which damping takes place, the signal supplied from adder 21 is multiplied by multiplication coefficient Sadmd from parameter control unit 100. The multiplication coefficient Sadmd is adjusted to an appropriate value considering the efficiency of the mechanical energy flow between a damper and a string. The result of the multiplication in multiplier 22 is then output therefrom as a string velocity signal $VS_1$ expressing the velocity with which the simulated string vibrates.

Figure 2:
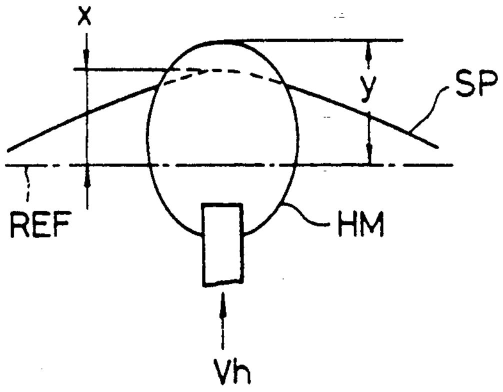
FIG. 2 is a schematic drawing illustrating the interaction between a string and a hammer in a conventional piano.

The string velocity signal $VS_1$ output from multiplier 22 is subsequently supplied to an adder 23 wherein this signal is added to the output signal of a multiplier 33, the nature of which will be described further on. The result of the addition operation is supplied to an integrator circuit 24 comprised in turn of an adder **24*a* and a one sampling interval delay circuit 24*b***, wherein the signal thus supplied is integrated, thereby yielding a string displacement signal X. This string displacement signal X expresses the displacement of the simulated string from a baseline position REF, which is the position at which the string rests when stationary, as shown in FIG. 2.

Once calculated in integrator circuit 24, string displacement signal X is then supplied to a subtractor 25 wherein it is subtracted from a displacement signal Y supplied from a delay circuit 37. The above mentioned displacement signal Y supplied from a delay circuit 37 represents the result of delaying an output signal from an integrator circuit 36, integrator circuit 36 consisting in turn of an adder **36*a* and a one sampling interval delay circuit 36*b***.

During simulation of an excitation operation, when the target instrument is a piano, the output signal from integrator circuit 36 which is delayed in delay circuit 37 so as to form displacement signal Y expresses the displacement of the exciting hammer from the baseline position REF. During simulation of a damping operation, the output signal from integrator circuit 36 which is delayed in delay circuit 37 so as to form displacement signal Y expresses the displacement of a damper block from the baseline position REF.

As stated above, string displacement signal X from integrator circuit 24 is subtracted from displacement signal Y in subtractor 25, thereby obtaining a relative displacement signal $Y-X$. For a target piano, depending on whether an excitation or damping operation is under simulation, relative displacement signal $Y-X$ expresses the position of the contacting surface of a hammer or damper, respectively, relative to the position of a corresponding string. Negative values for relative displacement signal $Y-X$ indicate that the hammer or damping block is not in contact with the string, a value of zero indicates that the string is in light contact with the hammer or damping block, and positive values therefor indicate that the hammer or damper block is in contact with and indented by the corresponding string.

The above described relative displacement signal $Y-X$ is output from subtractor 25 to a multiplier 26 and to a differentiator 27, consisting in turn of a one sampling period delay circuit 27*a* and a subtractor 27*b*. In multiplier 26, for positive values of relative displacement signal Y−X, this signal is multiplied by a multiplication coefficient Sh or multiplication coefficient Sd from parameter control unit 100, depending on whether an excitation or damping operation is under simulation, respectively, whereby an elastic repulsive force signal Fs is calculated. Thus, for positive values of relative displacement signal Y−X, when an excitation event is under simulation, multiplier 26 outputs an elastic repulsive force signal Fs given by Sh*(Y−X), whereas when a damping event is under simulation, multiplier 26 outputs an elastic repulsive force signal Fs given by Sd*(Y−X).

Multiplication coefficients Sh and Sd relate to elastic characteristics of the material making up the contacting surface of a hammer or damper, respectively, and elastic repulsive force signal Fs which results from multiplying relative displacement signal Y−X by multiplication coefficient Sh or Sd in multiplier 26 expresses the component of the repulsive force exerted by the contacting surface of a hammer or damper, respectively, attributable to the elastic characteristics of the contacting surface of the hammer or damper, against a string by which the contacting surface of the hammer or damper is indented.

The above mentioned differentiator 27 formed from one sampling period delay circuit 27*a* and subtractor 27*b* also receives relative displacement signal Y−X from subtractor 25. Differentiator 27 then calculates a differential displacement signal Δ(Y−X) which expresses the change of relative displacement signal Y−X.

The differential displacement signal Δ(Y−X) as thus obtained is supplied to the multiplier 28. During simulation of an excitation operation, a multiplication coefficient Rh is determined based on the viscosity of the material comprising the striking surface of a hammer which is supplied to a multiplier 28, whereby a signal is obtained having value Fr=Rh*Δ(Y−X) which corresponds to repulsive force between the hammer and string which is related to the viscosity of the material comprising the striking surface of the hammer. Similarly, when a damping operation is simulated, a multiplication coefficient Rd determined based on the viscosity of the damper is supplied to multiplier 28, whereby a signal is obtained having value Fr=Rd*Δ(Y−X) which corresponds to the repulsive force between the damper and string which is related to the viscosity of the damper.

In an adder 29, the sum of the output signals supplied from multipliers 26 and 28 is calculated, whereby a repulsive force signal F is obtained, which expresses the combined repulsive forces signal attributable to the elastic and viscous characteristics of a hammer or damper.

Figure 3:
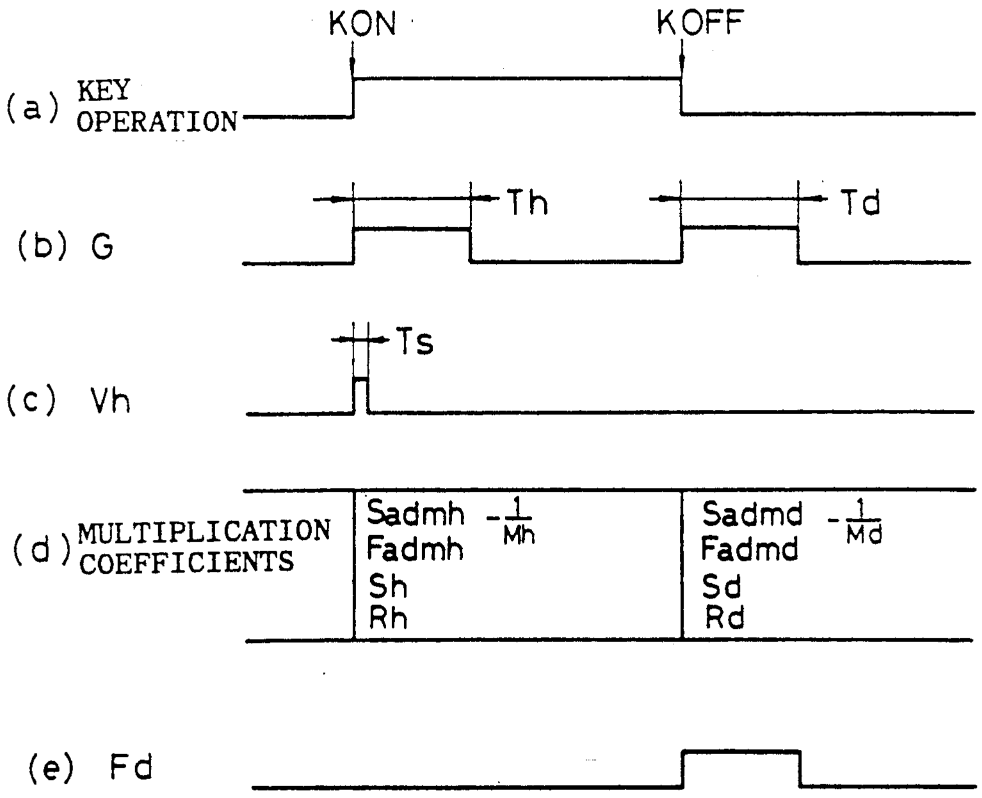
FIGS. 3(*a*) through 3(*e*) are time charts used to explain the flow of operation in the musical tone synthesizing apparatus shown in FIG. 1.

Repulsive force signal F is multiplied ½ in a multiplier 30, after which the output signal of multiplier 30 is supplied to gate circuit 31, wherein the output function is controlled by a gate enable signal G which is supplied from the parameter control unit 100. Thus, when gate enable signal G is activated, the signal F/2 output from multiplier 30 is then output from gate circuit 31, whereas when gate enable signal G is deactivated, the signal value of [0] is output from gate circuit 31. As shown in FIG. 3(*b*), gate enable signal G is supplied from parameter control unit 100 during the interval which starts at the time point at which a key-on signal KON is detected and ends following a predetermined time interval Th. Further, gate enable signal G is activated during the interval which starts at the time point at which a key-off signal KOFF is detected and ends following a predetermined time interval Td. At other times, gate enable signal G is not deactivated by the parameter control unit 100. Interval Th corresponds to the interval from when a hammer strikes a string up to the time point when the hammer moves away from the string. Interval Td is set so as to be longer than the time required for attenuating the vibration in a string to an insignificant level.

Alternately, gate signal G can be controlled using a comparator which compares the value of relative displacement signal Y−X with a reference value of [0]. Based on the comparison result, gate enable signal G is active when the relative displacement signal Y−X is greater than or equal to [0], i.e., when the hammer or damper is in contact with a string.

The output signal of the gate circuit 31 is delayed one sampling period by one sample period delay circuit 32, after which the delayed signal is supplied to multiplier 33. During simulation of an excitation operation, multiplication coefficient Fadmh is supplied to multiplier 33 which is determined based on the efficiency with which energy of a hammer is transmitted to a string, whereas when a damping operation is simulated, multiplication coefficient Fadmd is supplied to multiplier 33 which is determined based on the efficiency with which a damper absorbs energy from a string. A string velocity change signal Ps corresponding to the change in string velocity attributable to operation of a hammer or damper is output from multiplier 33. String velocity change signal Ps as thus obtained is added to string velocity signal $V_{s1}$ supplied from multiplier 22 in adder 23, whereby the string velocity signal $V_{s1}$ is corrected based on interaction between a hammer or damper and the string.

The previously described repulsive force signal F is supplied to a multiplier 34, wherein the supplied value is multiplied by a coefficient −1/Mh or −1/Md for simulation of an excitation operation or damping operation, respectively. Mh in the denomination of the coefficient used for simulation of excitation operations represents the mass of a hammer, whereas Md in the coefficient expressing the mass of a damper. As a result, multiplier 34 outputs an acceleration signal α corresponding to the acceleration imparted to the hammer or damper by the string. This acceleration signal α is then integrated in integrator 35. The one sample period delay circuit 35*b* is initialized when a key-on event is detected in the keyboard. More specifically, by the parameter control unit 100, the initial velocity signal Vh is generated according to the intensity of the key touch by which the key is depressed when the key-on signal KON is activated. The initial velocity signal Vh is stored in the one sample period delay circuit 35*b* as an initial value. A damping control signal Fd is supplied to the adder 35*a* from the parameter control unit 100 after the key-off signal KOFF is activated, during the predetermined interval Td as described above. This damping control signal Fd corresponds to the acceleration of the damper, wherein such acceleration is calculated based on the repulsive force between the damper and string when the damper is pressed against the string. During the simulation of excitation operation, the acceleration signal α is integrated in the integrator 35 to obtain velocity signal β which indicates the velocity of hammer to be simulated. In contrast, during the simulation of damping operation, the summation of acceleration signal $\alpha$ and the value of Fd is integrated in the integrator 35 to obtain the velocity signal $\beta$ which indicates the velocity of a damper to be simulated. Velocity signal $\beta$ as thus obtained is integrated in the integrator 36 to obtain displacement signal Y as described above.

Operation of the musical tone synthesizing apparatus will be described as follows.

Simulation of excitation operation

When a key of the key-board is depressed, the key-code data KC corresponding to the depressed key, and the initial touch data IT in response to the intensity of key touch, and the key-on signal KON are generated. As a result, control parameters are controlled by parameter control unit 100 as follows.

Delay designation data $T_1$ and $T_2$ corresponding to key-code code data KC are supplied to respective delay circuits 11 and 15, and the time period in which a signal circulates through closed loop circuit 10 is adjusted to be equal to the period of the musical tone which has the pitch corresponding to the key-code data KC. In one sampling period Ts after the key-on KON is generated, initial hammer velocity signal Vh determined in response to the initial touch data IT is supplied to one sample period delay circuit 35*b* as shown in FIG. 3(*c*). Initial value Vh is written in one sample period delay circuit 35*b*. While key-on signal KON is activated, multiplication coefficients Sadmn, Fadmh, Sh, Rh and $-1/Mh$ which are ready for the hammer are respectively supplied to the multipliers 22, 33, 26, 28 and 34. Gate enable signal G is generated during predetermined interval Th after the key-on signal KON is generated. Initialization is carried out as described above, and the simulation for the operation of the hammer and string starts from the initial state in which the repulsive force signal F equal [0], the acceleration signal $\alpha$ equal [0], the velocity signal $\beta$ equal Vh, i.e., simulating the state in which the hammer strikes the string with the velocity Vh.

The output signal of integrator 35 is integrated in the integral circuit 36. After the initialization, the same value of initial hammer velocity signal Vh is held in integrator 35, so that the value of Vh is integrated in the integral circuit 36, resulting in an increase of the value of displacement signal Y output from the integral circuit 36 increases. Based on this obtained displacement signal Y, the repulsive force signal $Fs=Sh*(Y-X)$ corresponding to one component of repulsive force acting between hammer and string, which is determined by the elastic characteristic of hammer, is outputted from the multiplier 26. Repulsive force signal $Fr=Rh*\Delta(Y-X)$ corresponding to the other component of repulsive force which is determined based on the stickiness of the hammer is output from multiplier 28. These repulsive force signals are summed by the adder 29 to obtain the total repulsive force signal $F=Fs+Fr$.

The repulsive force signal F is multiplied by $-1/Mh$ corresponding to the mass of hammer by multiplier 34, and the acceleration signal $\alpha$ is supplied to integrator 35 from the multiplier 34. Acceleration signal $\alpha$ has a negative value in this case. As a result, velocity signal $\beta$ as integrated in integrator 35 decreases from the initial value Vh. This velocity signal $\beta$ is integrated in the integrator 36, resulting in a decrease of increment of displacement signal Y which indicates the displacement of the hammer. In addition, the repulsive force signal F is multiplied by $\frac{1}{2}$ by multiplier 30, and the resulting signal F/2 is supplied to gate circuit 31. Since gate enable signal G is currently being generated, signal F/2 passes through the gate circuit 31, and is introduced to the adders 12 and 16 as an excitation signal. This excitation signal corresponds to the change of velocity of string imparted from the hammer. The excitation signals F/2 introduced to respective adders 12 and 16 circulate through the closed loop circuit 10. From an arbitrary node in the closed loop circuit determined, the circulating signal is picked up as a synthesized musical tone signal. In addition, the signals picked up from the output terminals of the delay circuits 11 and 15, are summed by adder 21. Then, the resulting signal is supplied to adder 23 to simulate the velocity signal $V_{s1}$ corresponding to the effect of the string on the hammer.

Excitation signal F/2 outputted from the gate circuit 31 is supplied to the multiplier 33 via the delay circuit 32. Multiplier 33 supplies the signal $Ps=(\frac{1}{2})Fadmd*F$ to adder 23. Signal Ps corresponds to the velocity component which is given to the string by the repulsive force between the hammer and string. The output signal Ps of multiplier 33 and the velocity signal $V_{s1}$ supplied from multiplier 23 are summed by adder 23, after which the resulting signal is integrated in the integrator 24. As a result, the string displacement signal X integrated in integrator 24 varies.

After the key-on signal KON is activated, for a while, the displacement signal Y corresponding to the displacement of hammer HM increases to indicate a displacement in the direction in which the hammer presses the string. The relative displacement signal $Y-X$ and the repulsive force signal F increase at the same time. Acceleration signal $\alpha=(-1/Mh)*F$ generated based on the repulsive force signal F. Velocity signal $\beta$ decreases which corresponds to a velocity in the direction in which the hammer parts from the string. The value of velocity signal $\beta$ decrease by degrees, and then becomes [0] corresponding to the hammer being at rest. Thereafter, a minus value of velocity signal $\beta$ is generated, whereby the value of displacement signal Y decreases toward [0]. Thus, the process in which the hammer parts from the string is simulated. These operations cause the value of relative displacement signal $Y-X$ and thus the value of repulsive force signal F to decrease by degrees. At last, the state in which the value of relative displacement signal Y is less than [0] is established. This state corresponds to the state in which the hammer is separated from the string, and there is no interaction between them, the simulation is over.

The above described interval Th, in which the gate enable signal G is being activated, is determined so that the interval Th nearly equals the time required for executing the simulation of the excitation operation. Accordingly, at the approximate time the simulation is over, the output of gate circuit 31 is disabled, causing the input of the excitation signal into closed loop circuit 10 to terminate. Thereafter, the signal circulation is repeated, each frequency component included in the signal is attenuated by the corresponding gain of the low-pass filter 13 every time the signal traverses it. In addition, when the gate enable signal G is deactivated, the content of delay circuit 32 is clear, whereby only the string velocity signal $V_{s1}$, which is picked up from the closed loop circuit 10 via the adder 21, the multiplier 22 and the adder 23, is integrated in the integrator 24, thus string displacement signal X is obtained from the integrator 24, signal X indicates the movement of the unrestricted string vibrating freely. In this manner, the signal circulation is excited in the closed loop circuit 10, and the signal circulating through the closed loop circuit is picked up from the desired node, for example, the output node of delay circuit 11, as the musical tone signal.

Simulation of damp operation

When the key which has been depressed is released, the key-off signal KOFF is supplied to the parameter control unit 100. As a result, respective control parameters are changed by the parameter control unit 100 as follows.

The value of [0] is written in the delay circuits **36*b*, 35*b* and 32. Additionally, as shown in FIG. 3**(*c*), the multiplication coefficients Sadmd, Fadmd, Sd, Rd, −1/Md are respectively supplied to the multipliers 22, 33, 26, 28 and 34, wherein the multiplication coefficients are respectively determined based on the physical characteristics of the damper. Furthermore, during the predetermined time interval Td which begins at the time the key-off signal KOFF has been activated, the gate enable signal G is activated and the damping control signal Fd is supplied to the adder **35*a* provided in integrator 35**, where the value of damping control signal Fd is determined based on the pressure of the damper on the string. With this parameter control, the musical tone synthesizing apparatus is initialized corresponding to the state in which the damper comes into contact with the string at the point corresponding to Y=[0], after which the simulation of the damping operation starts.

From the current string displacement signal X, the displacement signal Y which corresponds to the displacement of the damper, and has a value of [0], is subtracted by the subtractor 25, and the relative displacement signal Y−X (=−X) is obtained. Based on the value of relational displacement signal Y−X as thus obtained, the repulsive force signal Fs=Sd*(Y−X) corresponding to the component of repulsive force which interacts between the damper and the string, is output from the multiplier 26. In addition, the repulsive force signal Fr=Rd*Δ(Y−X) corresponding to the other component of repulsive force which is determined from the viscosity of the damper is output from the multiplier 28. These repulsive force signals are summed by the adder 29, whereby the total repulsive force signal F=Fs+Fr is obtained.

The repulsive force signal F is multiplied by −1/Md, which corresponds to the mass of the damper, output by the multiplier 34, and the acceleration signal $\alpha$ is obtained. The acceleration signal $\alpha$ and the damping control signal Fd are summed and integrated in integral circuit 35, whereby the velocity signal $\beta$ corresponding to the velocity of the damper is obtained. The velocity signal $\beta$ is integrated in the integral circuit 36, whereby the value of displacement signal Y, which indicates the displacement of the damper, varies by degrees. In addition, the repulsive force signal F is multiplied by $\frac{1}{2}$ by the multiplier 30, after which the resulting signal, F/2 is supplied to gate circuit 31. Since the gate enable signal has been activated by a key-off signal, the signal, F/2, passes through the gate circuit 31, whereby the same signal F/2 is introduced to the adders 12 and 16 as the damp signal corresponding to the influence of the damper which varies the velocity of the string.

In addition, similar to the simulation of the excitation operation, the signal F/2 output from gate circuit 31 is supplied to the multiplier 33 via the delay circuit 32, whereby the multiplier 33 supplies the signal Ps=($\frac{1}{2}$)Fadmd*F to the adder 23. The signal Ps corresponds to the velocity component which is given to the string by the repulsive force between it and the damper. Adder 23 sums the output signal Ps of the multiplier 33 and the velocity signal $V_{s1}$ supplied from the multiplier 23 are summed, after which the resulting summation is integrated in the integrator 24. The value integrated in the integrator 24, i.e., the string displacement signal X varies as a result.

After the key-off signal KOFF has been activated, for a while, the repulsive force signal F, acceleration signal $\alpha$, velocity signal $\beta$ and displacement signal Y, corresponding to the damper, respectively vary in response to the time variation of the string displacement signal x which is output from the integrator 24. However, in the integrator 35, the integral operation for the damping control signal Fd progresses and the integral value from the integral circuit 35 increases, whereby the amplitudes of signals F, $\alpha$, $\beta$ and Y decrease. Thus, the amplitudes of signals F, $\alpha$, $\beta$ and Y respectively, converge to constant values. Consequently, the value of signal F/2 input into the closed loop circuit 10 converges to a constant value, thus alternative components included in the signal circulating through closed loop circuit 10 are attenuated. In this manner, the damp operation in which the damper comes into contact with the string and the vibration of the string terminates, is simulated.

[B] Second preferred embodiment

Figure 4:
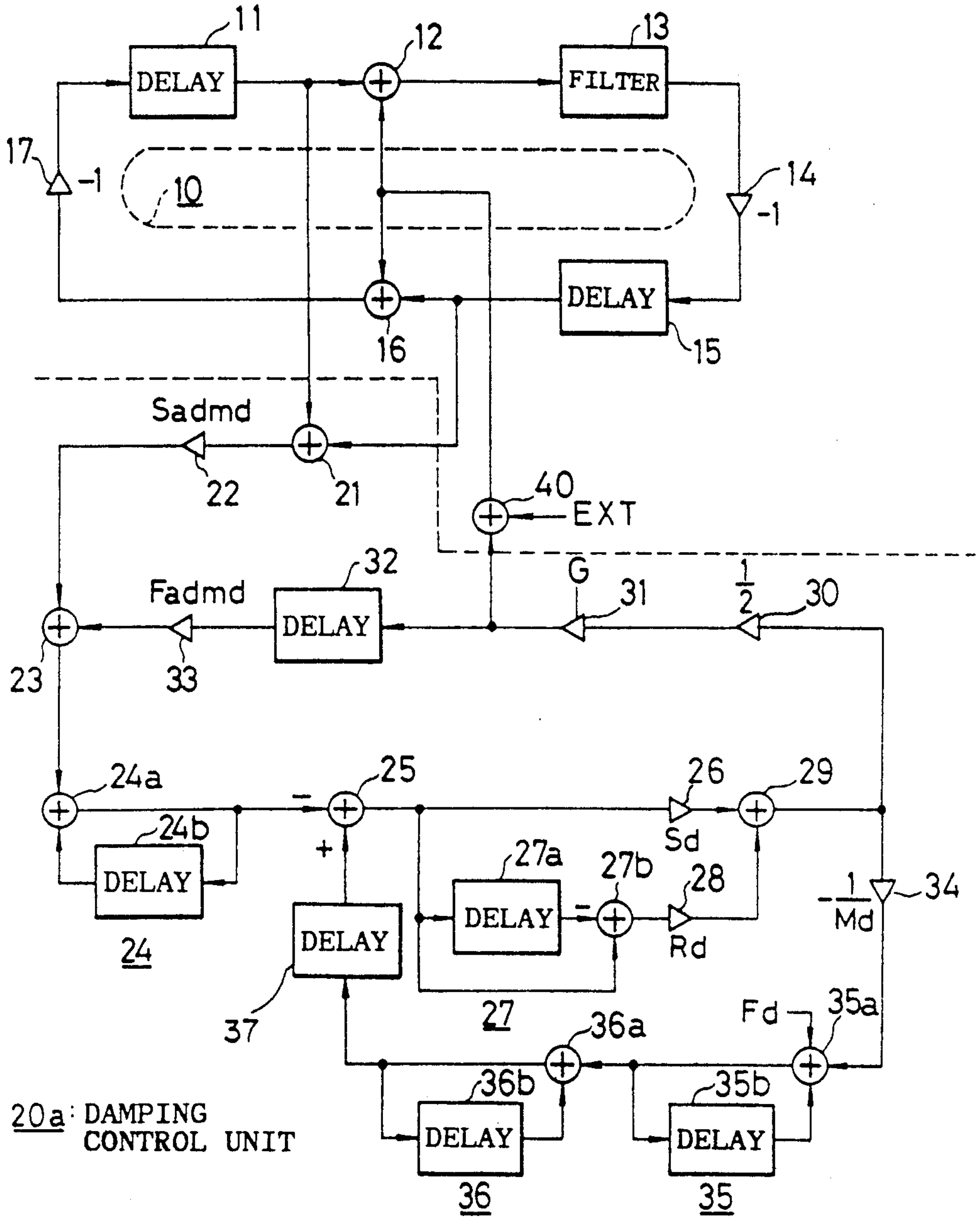
FIG. 4 is a block diagram showing the overall layout of a musical tone synthesizing apparatus in accordance with a second preferred embodiment of the present invention.

FIG. 4 is a block diagram showing the configuration of a musical tone synthesizing apparatus which is the second version of the present invention. In this apparatus, a damping control unit **20*a* is provided. The configuration of the damping control unit 20*a* is same as the excitation and damping control unit 20 shown in FIG. 1. Thus, for the respective components in FIG. 4, the same character symbols which are assigned to the corresponding components shown in FIG. 1 are used. However, for the multipliers 22, 33, 26, 28 and 34, the multiplication coefficients Sadmd, Fadmd, Sd, Rd, −1/Md are always supplied and are not changed. The damping control unit 20*a*, only simulates the damp operation in which the damper comes into contact with the string and terminates its vibration. An adder 40 is provided for adding the output signal of the damping control unit 20*a* and an excitation signal EXT is supplied by means of excitation. This excitation means may be constituted of a waveform memory for storing an excitation waveform, which is generated by the string and hammer, and a circuit for reading out the excitation waveform from the waveform memory and supplying the read-out data to the adder 40. In another preferred embodiment, an excitation control unit can be connected to the adder 40, wherein the excitation control unit is constituted by the same circuit of the damping control unit 20*a*** and the multiplication coefficient determined based on the characteristics of the hammer are set to the multipliers.

[C] Third preferred embodiment

Figure 5:
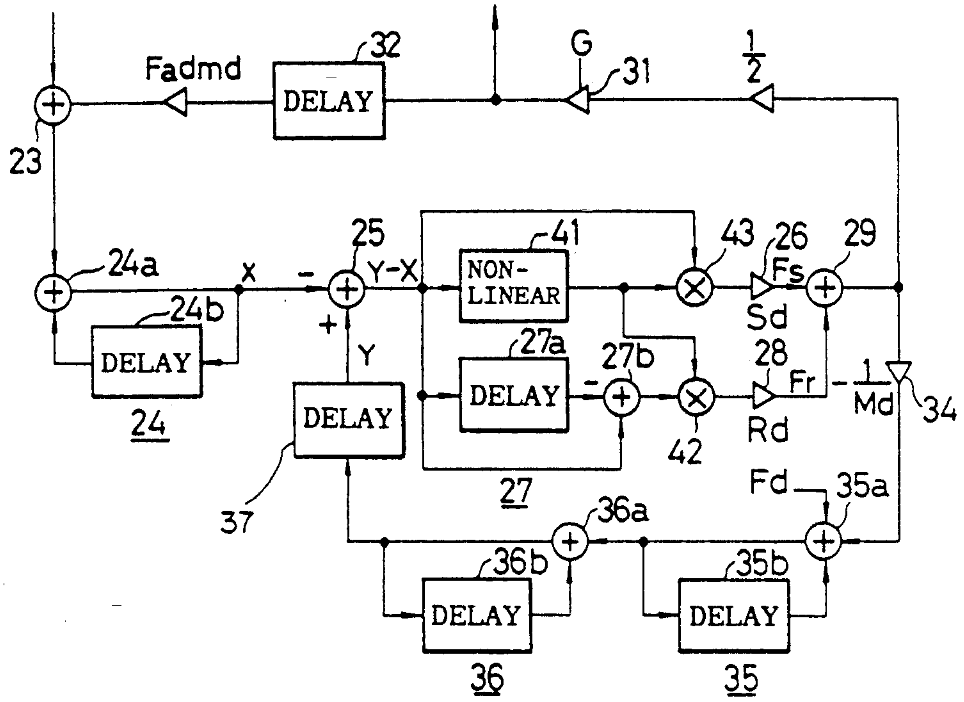
FIG. 5 is a block diagram showing the overall layout of a musical tone synthesizing apparatus in accordance with a third preferred embodiment of the present invention.
Figure 6:
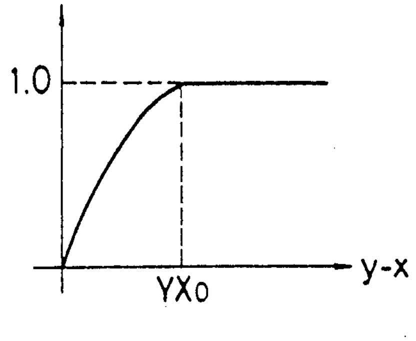
FIGS. 6 and 7 are graphs illustrating non-linear functions which describe processing carried out in the musical tone synthesizing apparatus shown in FIG. 3.
Figure 7:
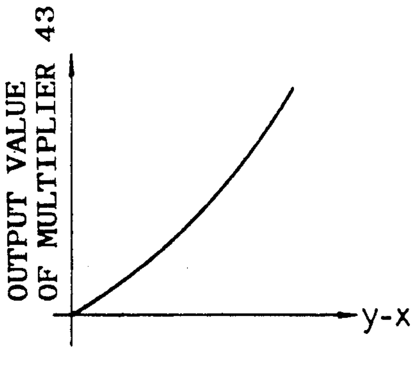

FIG. 5 is a block diagram showing the configuration of the third preferred embodiment. In FIG. 5, the configuration of the circuit corresponding to the excitation and damping control unit 20 shown in FIG. 1, or the damping control unit **20*a* shown in FIG. 4, is shown. In the first and second preferred embodiments, the simulation is performed by supposing that the elastic characteristics of the hammer and damper are linear. However, in the third preferred embodiment, the simulation is performed considering the non-linear elastic characteristics of the hammer and damper. Provided is a ROM 41 in which the non-linear function table shown in FIG. 6 is stored. To the ROM 41, the relational displacement signal $Y-X$ is supplied as the read-out address. A multiplier 43 multiplies the relational displacement signal $Y-X$ with the output signal of the ROM 41. By this configuration, the relationship between the relational displacement signal $Y-X$ and the output signal of the multiplier 43, the non-linear response shown in FIG. 7**, is obtained so that the elastic component of the repulsive force is calculated, wherein the elastic component is varied, describing a parabola in response to the relative displacement of the string and the hammer or damper and the elastic component of the force.

In addition, the output signal of the ROM 41 and the output signal $\Delta(Y-X)$ of the differential circuit 27 are multiplied by a multiplier 47, after which the result of the multiplication is supplied to the multiplier 28. By this configuration, in the case where $Y-X=[0]$, the stickiness component of the repulsive force Fr is [0]. However, in the case where $Y-X>0$, when the value of $Y-X$ increases, the ratio by which the value of $\Delta(Y-X)$ causes the variation of the stickiness component of the repulsive force increases. When the value of $Y-X$ is more than a predetermined value $YX_0$, the stickiness component Fr is varied in proportion to the value of $\Delta(Y-X)$. In the third preferred embodiment, the excitation and damp operations of an acoustic piano are actually simulated more than in the case of the first and second embodiments.

In the above-described preferred embodiments, the value of the damping control signal Fd corresponding to the pressure applied to the string by the damper is fixed. However, the value of the damping control signal Fd must not be a constant value. For example, the damping control signal Fd can be controlled in response to the pressure by which keys are released. In this case, the release operation in an acoustic piano is actually simulated. In an actual acoustic piano, the characteristics of the individual hammer and damper are different, key by key. For this reason, in the above-described preferred embodiments, it is more effective for realistic performance, to control the multiplication coefficients of the multipliers provided in the excitation and damping control unit based on key codes of the depressed keys. Further, the delay circuits can be implemented in not only shift registers but also RAM. Further more, the closed loop circuit can be constituted by the wave guide disclosed in Japanese Patent Publication No. 63-40199.

The preferred embodiments are described supposing the case in which the present invention is applied to the synthesis of musical tones generated by a percussive string instrument. However, the application of the present invention is not restricted to this case. The present invention is applicable to the synthesis of musical tones which are generated by other acoustic instruments, for example, plucked string instruments and the like. Further more, the mute performance performed on wind instruments, and harmonic performance performed on guitars and the like can be simulated by the present invention. In addition, the present invention can be implemented not only in digital circuits but also analog circuits, and software processing operated by DSP (Digital Signal Processor).

What is claimed is:

1. A musical tone synthesizing apparatus which synthesizes musical tones comprising:

a) a closed loop circuit which contains at least a delay element, said closed loop circuit having a specific resonance characteristic corresponding to the pitch of a tone signal to be generated;

b) excitation signal generating means for generating an excitation signal which is input into said closed loop circuit, said excitation signal corresponding to an excitation parameter signal supplied to the excitation signal generating means; and c) damping means for receiving an output signal from said closed loop circuit and subjecting it to a predetermined process corresponding to a damping parameter signal supplied to the damping means, the signal resulting therefrom being supplied to said closed loop circuit as a feedback signal.

2. A musical tone synthesizing apparatus for synthesizing musical tones of an acoustic instrument, said musical tone synthesizing apparatus comprising:

a) a closed loop circuit containing at least a delay element, said closed loop circuit corresponding to a vibrating element of said acoustic instrument wherein a tone signal is extracted from the closed loop circuit;

b) parameter generating means for generating excitation parameters and damping parameters corresponding to objects which are in contact with said vibrating element to start vibration of the vibrating element and damp vibration of the vibrating element, respectively; and c) signal generating means for generating signals to be introduced to said closed loop circuit, the signal generating means generating said signals to be introduced based on said parameters.

3. A musical tone synthesizing apparatus according to claim 2 further comprising:

transmission control means for controlling the signal input into said closed loop circuit.

4. A musical tone synthesizing apparatus according to claim 2, wherein one of said objects is an excitation operator for imparting an excitation vibration to said vibrating element, and another of said objects is a damping operator for decaying a vibration of said vibrating element rapidly.

5. A musical tone synthesizing apparatus which synthesizes musical tones comprising:

a) a closed loop circuit which contains at least a delay element, said closed loop circuit having a specific resonance characteristic corresponding to the pitch of a tone signal to be generated; and b) damping means for receiving an output signal from said closed loop circuit and subjecting it to a predetermined process corresponding to a damping parameter signal supplied to the damping means, the signal resulting therefrom then supplied to said closed loop circuit as a feedback signal.

6. A musical tone synthesizing apparatus according to claim 2, wherein when generating muscial tones, said parameter generating means generates excitation control parameters corresponding to the action of an excitation operator of said acoustic instrument and excitation calculation coefficients corresponding to the physical characteristics of said excitation operator, and said signal generating means generates signals to be introduced to said closed loop circuit based on said excitation control parameters and excitation calculation coefficients, when damping musical tones, said parameter generating means generates damping control parameters corresponding to the action of a damping operator of said acoustic instrument and damping calculation coefficients corresponding to the physical characteristics of said damping operator, and said signal generating means generates signals to be introduced to said closed loop circuit based on said damping control parameters and damping calculation coefficients.

7. A musical tone synthesizing apparatus according to claim 2, wherein a circuit constituting said signal generating means is used for simulating both contact between said vibrating element and an object to start vibration and contact between said vibrating element and an object to damp vibration.

8. A musical tone synthesizing apparatus as in claim 2 wherein the signal generating means includes damping means for generating damping signals to be introduced to said closed loop circuit, wherein the damping signals are subtractive signals which reduce the value of signals in the closed loop circuit.

* * * * *